United States Patent
Dhere et al.

(10) Patent No.: US 7,632,701 B2
(45) Date of Patent: Dec. 15, 2009

(54) THIN FILM SOLAR CELLS BY SELENIZATION SULFURIZATION USING DIETHYL SELENIUM AS A SELENIUM PRECURSOR

(75) Inventors: Neelkanth G. Dhere, Merritt Island, FL (US); Ankur A. Kadam, Santa Clara, CA (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 92 days.

(21) Appl. No.: 11/745,621

(22) Filed: May 8, 2007

(65) Prior Publication Data

US 2007/0257255 A1 Nov. 8, 2007

Related U.S. Application Data

(60) Provisional application No. 60/801,520, filed on May 18, 2006, provisional application No. 60/798,680, filed on May 8, 2006.

(51) Int. Cl.
*H01L 21/00* (2006.01)

(52) U.S. Cl. ............................ 438/84; 438/57; 438/85; 257/E31.001; 257/E27.123

(58) Field of Classification Search ................. 438/57, 438/84, 85; 257/E31.001, E27.123
See application file for complete search history.

(56) References Cited

U.S. PATENT DOCUMENTS

| | | | | |
|---|---|---|---|---|
| 5,436,204 A | * | 7/1995 | Albin et al. | 438/488 |
| 5,674,555 A | * | 10/1997 | Birkmire et al. | 427/76 |
| 7,582,506 B2 | * | 9/2009 | Basol | 438/95 |
| 2005/0186342 A1 | * | 8/2005 | Sager et al. | 427/248.1 |

OTHER PUBLICATIONS

Deryagina, E.N., et al. "Selenium- and tellurium-centred radicals," Russian Chemical Reviews 62(12), p. 1107-1117. Russian Academy of Sciences and Turpion Ltd.: 1993.

* cited by examiner

*Primary Examiner*—Alexander G Ghyka
*Assistant Examiner*—Seahvosh J Nikmanesh
(74) *Attorney, Agent, or Firm*—Patents on Demand, P.A.; Neil R. Jetter

(57) ABSTRACT

A method of forming a CIGSS absorber layer includes the steps of providing a metal precursor, and selenizing the metal precursor using diethyl selenium to form a selenized metal precursor layer (CIGSS absorber layer). A high efficiency solar cell includes a CIGSS absorber layer formed by a process including selenizing a metal precursor using diethyl selenium to form the CIGSS absorber layer.

8 Claims, 3 Drawing Sheets

THIN FILM SOLAR CELLS BY SELENIZATION SULFURIZATION USING DIETHYL SELENIUM AS A SELENIUM PRECURSOR

CROSS-REFERENCE TO RELATED APPLICATIONS

The present application incorporates by reference and claims priority to U.S. Provisional Patent Application Ser. No. 60/798,680 filed May 8, 2006, and U.S. Provisional Patent Application Ser. No. 60/801,520 filed May 18, 2006, both entitled "Thin Film Solar Cells By Selenization Sulfurization Using Diethyl Selenium as a Selenium precursor"

STATEMENT REGARDING FEDERALLY SPONSORED RESEARCH OR DEVELOPMENT

The United States Government has rights in this invention pursuant to National Renewable Energy Laboratory Contract # XXL-5-44205-08.

FIELD OF THE INVENTION

The invention relates to thin film solar cells, in particular to $CuIn_{1-x}Ga_xSe_{2-y}S_y$ (CIGSS)-based solar cells.

BACKGROUND OF THE INVENTION

A solar cell is a semiconductor device that converts photons from the sun (solar light) into electricity. Fundamentally, the solar cell needs to photogenerate charge carriers (electrons and holes) in a light-absorbing material, and separate the charge carriers to electrically conductive contacts that will transmit the electricity.

First generation photovoltaics comprise large-area single layer p-n junction diodes, which generate usable electrical energy from light sources with the wavelengths of solar light. These cells are typically made using silicon. Second generation photovoltaic devices are based on multiple layers of p-n junction diodes. Each layer is designed to absorb a successively longer wavelength of light (lower energy), thus absorbing more of the solar spectrum and increasing the conversion efficiency and thus the amount of energy produced. The third generation of photovoltaics is quite different from the first two generations, and is broadly defined as a semiconductor device which does not rely on a traditional p-n junction to separate photogenerated charge carriers. These new devices include dye sensitized cells, organic polymer cells, and quantum dot solar cells.

All solar cells require a light absorbing material contained within the cell structure to absorb photons and generate hole electron pairs via the photovoltaic effect. The materials used in solar cells tend to have the property of preferentially absorbing the wavelengths of solar light that reach the earth surface. One second generation solar cell embodiment comprises CIGS-based solar cells. CIGS are multi-layered thin-film composite solar cells. The abbreviation CIGS stands for copper indium gallium selenide ($CuIn_{1-x}Ga_xSe_2$). Unlike the basic silicon solar cell, which can be accurately modeled as a simple p-n junction, CIGS based solar cells are best described by a more complex heterojunction model. Solar cells based on CIGS have achieved the highest efficiency of all thin film solar cells.

Solar cells based on p-type CIGS absorbers have been fabricated on glass, polymer or stainless steel substrates using various deposition techniques. A cross sectional view of a typical CIGS device 100 is shown in FIG. 1. Incident sunlight 102 is partially blocked by the metallic grid shown as Ni/Al fingers 105, which covers approximately 5% of the surface of the device, and is partially reflected by the surface of the transparent conducting-oxide (TCO) layer, shown as a ZnO/ZnO:Al layer 110 due to the difference in the index of refraction. Some short-wavelength photons are absorbed in the n-CdS layer 125. Most of the sunlight, however, enters the semiconductor and is absorbed in the CIGS absorber layer 130. CIGS absorber layer 130 is shown disposed on molybdenum layer 135, which is disposed on the soda lime substrate 140 shown.

The front metal contact fingers (Ni/Al) 105 are not critical to the photovoltaic operation. The ZnO 110 and CdS layers 125 are usually n-type, and the CIGS layer 130 is usually p-type. The semiconducting junction is formed at or near the CdS 125-CIGS 130 (n-p) interface. Electrons that are generated within the junction-field region or within about one diffusion length of the n-p junction will generally be collected.

$CuIn_{1-x}Ga_xSe_{2-y}S_y$ (CIGSS) is a sulfur comprising variant of CIGS which as noted above is based on $CuIn_{1-x}Ga_xSe_2$. CIGSS is by far the most promising material for thin film photovoltaic devices. There is constant research performed to increase photovoltaic conversion efficiency. What is needed is a relatively simple process and/or material or structural change(s) to provide a significant increase in photovoltaic conversion efficiency.

SUMMARY

A method of forming a CIGSS absorber layer comprises the steps of providing a metal precursor, and selenizing the metal precursor using diethyl selenium to form a selenized metal precursor layer (CIGSS absorber layer). The metal precursor can comprise Cu—In—Ga. In one embodiment, the metal precursor is homogenized in an inert atmosphere before selenizing. In another embodiment the metal precursor is heated to a temperature below a melting point of indium before introducing the diethyl selenium, wherein the metal precursor and the diethyl selenium are then heated to a temperature above 450° C. for sufficient time to complete formation of the CIGSS layer. The method can further comprises the step of removing gases during a cooling cycle after the selenization step when the temperature is above 450° C. The method can also further comprise the step of annealing the CIGSS layer in a sulfur comprising ambient, wherein a selenized CIGSS absorber layer is formed.

The method can further comprising the step of providing a substrate, and depositing a back contact layer prior to forming the CIGSS absorber layer, wherein the CIGSS absorber layer is formed on said back contact layer, depositing a heterojunction partner layer on the CIGSS absorber layer, depositing an optically transparent and conducting window layer on the heterojunction partner layer, and forming contact fingers on the optically transparent and conducting window layer, wherein a solar cell is formed.

A solar cell comprises a substrate, a back contact layer on the substrate; a CIGSS absorber layer formed on the back contact layer, wherein the CIGSS absorber layer is formed by a process comprising the steps of providing a metal precursor, and selenizing the metal precursor using diethyl selenium to form the CIGSS absorber layer. A heterojunction partner layer is disposed on the CIGSS absorber layer, an optically transparent and conducting window layer on the heterojunction partner layer, and contact fingers on the optically transparent and conducting window layer. The CIGSS absorber layer can comprises a selenized CIGSS absorber layer, and the optically transparent and conducting window layer can comprises ZnO.

BRIEF DESCRIPTION OF THE DRAWINGS

A fuller understanding of the present invention and the features and benefits thereof will be obtained upon review of the following detailed description together with the accompanying drawing, in which.

DETAILED DESCRIPTION

A method of forming a CIGSS absorber layer comprises the steps of providing a metal precursor, selenizing the metal precursor in a heated volume such as a conventional furnace using diethyl selenium to form a selenized layer of metal precursor. The metal precursor is deposited by a suitable technique and is preferably homogenized.

The metal precursor can comprise Cu—In—Ga. In a preferred embodiment, the heat treatment process is modified by allowing premixing of the metallic precursor Cu—In—Ga by first heating the elemental layer(s) below the melting point of indium i.e. 156.6° C. in vacuum or in an inert gas atmosphere. Diluted diethyl selenium is then preferably introduced at a later stage of the process prior to crossing over the melting point of indium to prevent formation of deleterious binary compounds.

The invention provides a novel selenium precursor to be used for preparation of a CIGSS absorber layer, and for the preparation of CIGSS thin film solar cells. The metalorganic compound diethyl selenium, a selenium precursor, has lower toxicity and requires comparatively less stringent safety requirement as compared to $H_2Se$ which is currently used to form CIGSS absorbers.

In a preferred embodiment, the temperature is increased above 450° C. and held for more than 10 minutes for the reaction to occur.

In a preferred embodiment the diethyl selenium is pumped out after the completion of selenization step during the cooling cycle when the temperature is still above 450° C. Removing the diethyl selenium precursor gas when the temperature is above 450° C. prevents contamination from carbon, liberated during dissociation of DESe at temperature above 450° C. and also creates a fresh background for provision of the appropriate sulfur precursor. The method preferably further comprises the step of annealing the selenized layer of metal precursor in sulfur comprising ambient, wherein a selenized-sulfurized absorber layer is formed. Sulfinurization is carried out in similar temperature regime (above 450° C.) for a period preferably more than 10 minutes.

CIGSS films grown using the invention are free of harmful binary compounds. Moreover large, compactly packed and faceted grains are provided. Carrying out sulfurization after selenization creates a sulfur profile along the thickness of the film. Higher sulfur concentrations are found at the surface and at the interface of CIGSS with molybdenum back contact. It is believed that sulfur passivates the surface and grain boundaries and therefore improves the performance.

The process described herein is a readily scalable, cost-competitive process and is expected to be widely applicable to CIGSS processes.

Figure 2:
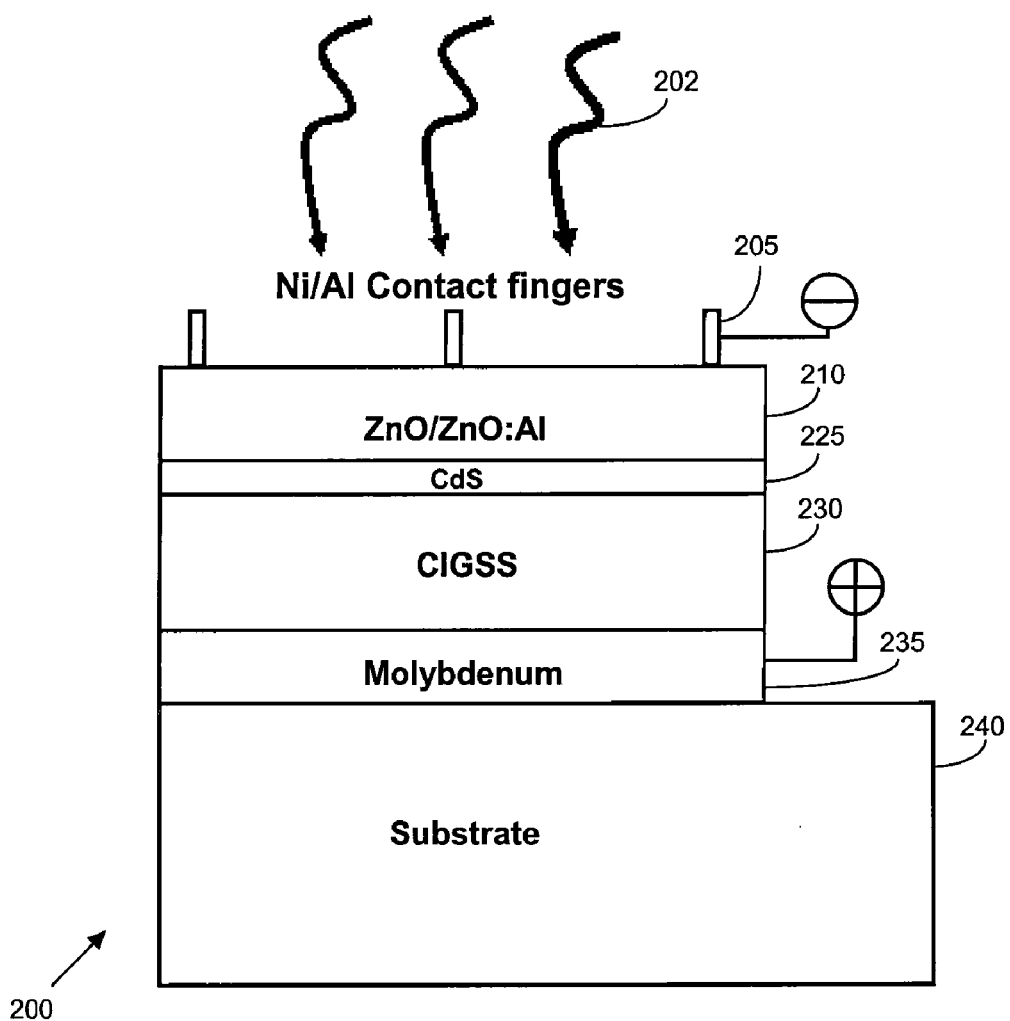
FIG. 2 shows a cross sectional view showing the various layers comprising a CIGSS-based thin film solar cell according to the present invention.

FIG. 2 shows a cross sectional view showing the various layers comprising a CIGSS-based thin film solar cell 200 according to the present invention. Incident sunlight 202 is partially blocked by the metallic grids fingers 205, and is partially reflected by the surface of the transparent conducting-oxide (TCO) layer, shown as a ZnO/ZnO:Al layer 210 due to the difference in the index of refraction. Other generally suitable TCO layers include, but are not limited to, Indium-tin oxide (ITO) and fluorine doped tin oxide $SnO_2$:F. There are also the options of using thick CdS layer or thick CdZnS layer with or without indium doping both without any additional TCO layer. A typical thickness range for the ZnO/ZnO:Al layer 210 is 0 nm (no ZnO) to 100 nm and ZnO:Al 200 nm to 1000 nm.

Some short-wavelength photons are absorbed in the n-CdS layer 225 shown. Generally suitable alternatives to the n-CdS layer 225, include, but are not limited to, $ZnInSe_x$, $In_xSe_y$, ZnMgO, $SnO_2$ and $SnS_2$ or compounds based on ZnS(O,OH), CdZnS(O,OH), ZnSe, $In(OH)_3$, and $In_2S_3$. A typical thickness range for the CdS layer 225 is in the range from 0 nm (no CdS present) to 100 nm. Most of the sunlight enters the semiconductor and is absorbed by CIGSS absorber layer 230 according to the invention. A typical thickness range for the CIGSS layer 230 is 750 nm to 3000 nm, such as 1500 mm.

CIGS absorber layer 230 is shown disposed on molybdenum (Mo) back contact layer 235. Other generally suitable back contact layers include, but are not limited to, tungsten, tantalum, and niobium, indium-tin oxide (ITO), fluorine doped tin oxide $SnO_2$:F described above as suitable for the TCO layer, and well as others layers which are generally suitable as TCO layers. The thicknesses of the back contact layers range from 200 nm to 1000 nm. Back contact layer which is disposed on the substrate 240. Suitable substrates are glass, ceramic, and stainless steel, titanium, molybdenum, tungsten, tantalum, niobium, and a variety of polymers including poly(4,4'-oxydiphenylene-pyromellitimide) (marketed as KAPTON™) and other polyimides, as well as certain fluorocarbon-based polymers such as ETFE (Ethylene TetrafluoroEthylene) (marketed as TEFZEL™).

EXAMPLES

It should be understood that the Examples described below are provided for illustrative purposes only and do not in any way define the scope of the invention.

Figure 1:
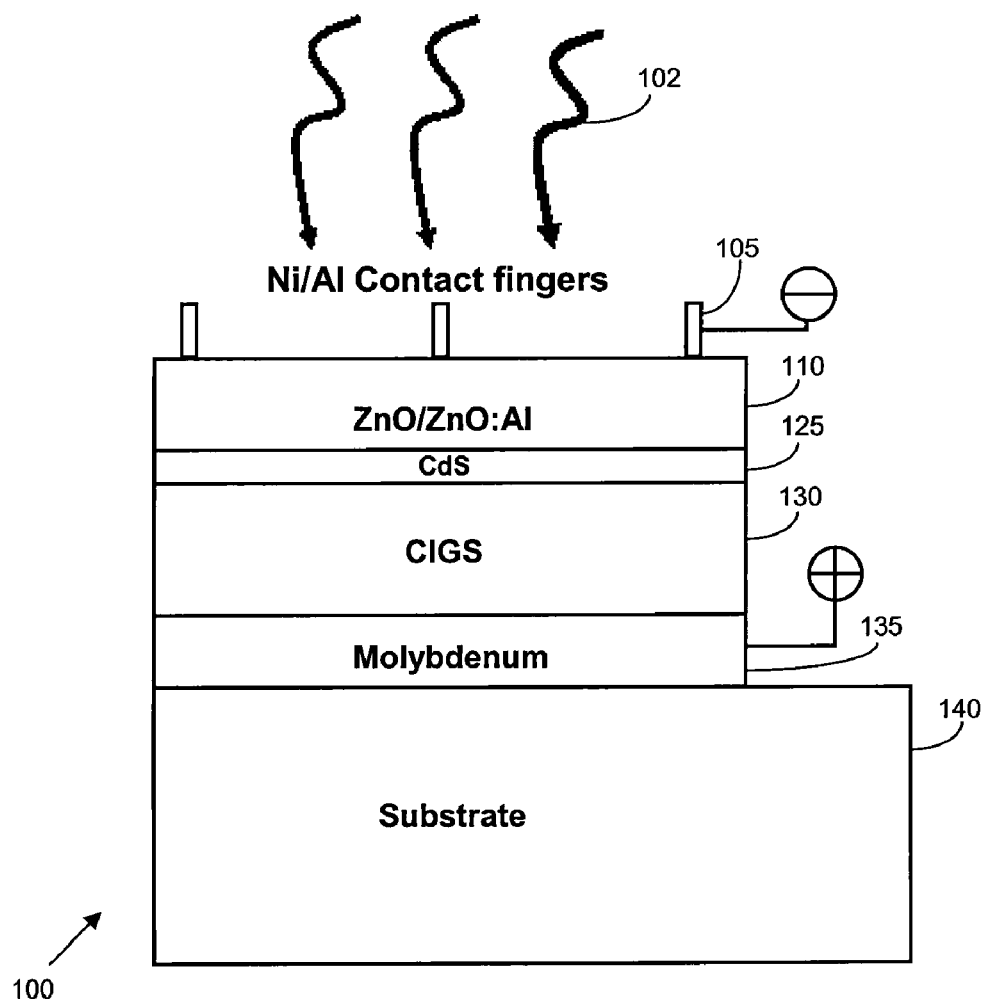
FIG. 1 is a schematic cross sectional view showing the various layers comprising a known CIGS-based thin film solar cell.

The Mo back contact and Cu—Ga—In metallic precursors were deposited by DC magnetron sputtering. The elemental stack was then mounted in a furnace for selenization and sulfurization. The metallic precursors were heated in presence of nitrogen gas. The gases filled at room temperature were exhausted at 120° C. By the time the gases were exhausted completely the temperature reached approximately 135° C. to 140° C. At this stage diethyl selenium (DESe) was introduced in the reaction tube. The generally required amount of DESe in terms of pressure (6 to 9 Torr partial pressure) was filled in 3 to 4 minutes. During this period the temperature reached approximately 144° C.-147° C. The dilution gas, nitrogen, was filled at this stage to maintain the required pressure in the chamber. Depending up on the set of parameters of the experiment, the sample was maintained at the maximum temperature above 450° C. for 10 to 60 minutes. In the case of samples that were only selenized and not sulfurized, the gases were pumped out during the cooling cycle at a temperature over 450° C. In the case of the samples that were sulfurized after selenization, the gases were pumped out immediately at the end of selenization at the maximum process temperature. $H_2S$ diluted in nitrogen (dilution ration 5%) was then introduced for carrying out sulfurization. During the cooling cycle the reactive gases were exhausted between 450° C.-485° C. Solar cells were then completed by depositing a heterojunction partner CdS layer on the CIGSS absorber followed by a ZnO/ZnO:Al optically transparent and conducting window layer and Ni/Al or Cr/Ag front contact fingers to form a solar cell analogous to CIGS device 100 shown in FIG. 1 and CIGSS device shown in FIG. 2.

Figure 3:
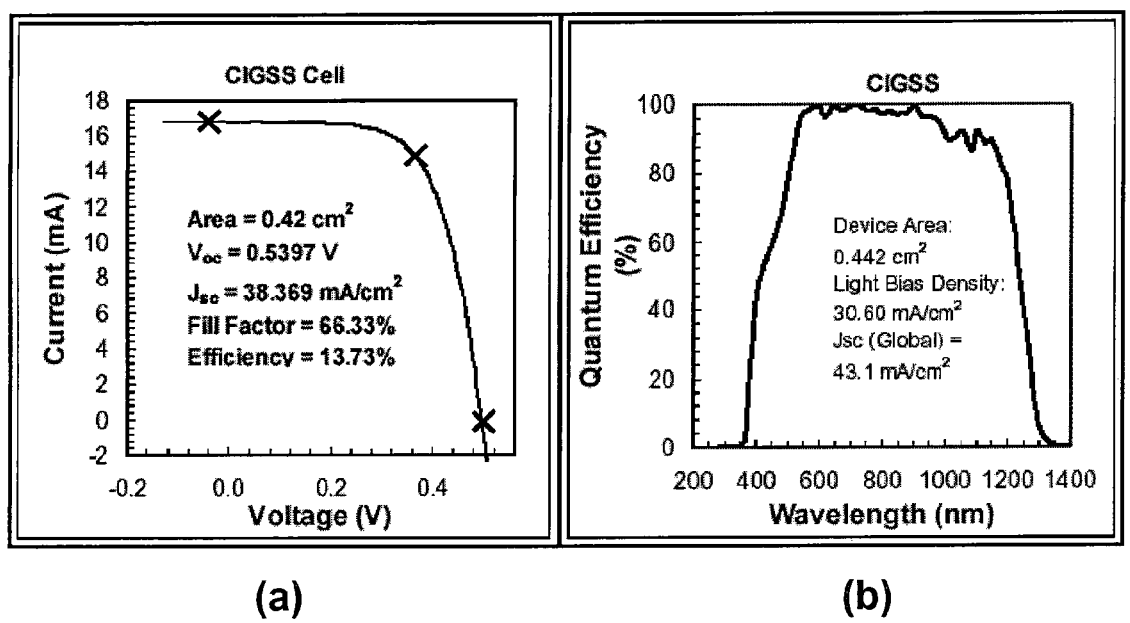
FIGS. 3(a) and (b) show the current-voltage characteristic and the quantum efficiency (QE) of an exemplary CIGSS/CdS thin film solar cell formed according to the present invention, respectively.

The current-voltage characteristic and the quantum efficiency (QE) of an exemplary CIGSS/CdS thin film solar cell formed according to the present invention is shown in FIGS. 3(*a*) and 3(*b*), respectively. Very small quantities of sodium fluoride (NaF) were added (deposited) on the molybdenum layer or on the metallic precursor layers of Cu—In—Ga, or added (deposited) during the deposition of the metallic precursors Cu—In—Ga, with or without selenium. Na reduces the donor type defects and thereby increases the p-type conductivity. The open circuit voltage (Voc) was found to be 540 mV. The highest efficiency of 13.73% shown was measured under the standard AM1.5-G (IEC 60904) condition; Corresponding device temperature was: 25.0±1.0° C., device Area: 0.442 $cm^2$. The electrical parameters were open circuit voltage, Voc—540 mV, short circuit current density, Jsc—38.37 mA/$cm^2$ and fill factor, FF—66.33%. The morphology of the films were studied by scanning electron microscopy, which evidenced the grains are highly faceted and had dimension greater than 1 μm. Moreover, a cross-sectional view revealed the grains extended from back contact to the surface. No dip at 800 nm in quantum efficiency shown in FIG. 3(*b*) which was evident in earlier work was observed likely because sulfur passivated the recombination centers. The curve was flat in the center region.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

The invention claimed is:

1. A method of forming a CIGSS absorber layer, comprising the steps of:
    forming a metal precursor;
    homogenizing said metal precursor at a temperature sufficient for homogenizing said metal precursor but below a melting point of indium;
    after said homogenizing, selenizing said metal precursor using diethyl selenium to form a selenized metal precursor layer (CIGSS absorber layer), wherein a flow of said diethyl selenium to begin said selenizing is first initiated before said metal precursor reaches said melting point temperature of indium; and
    further comprising the step of removal of gases during a cooling cycle after said selenization step when said temperature is above 450° C.

2. The method of claim 1, wherein said metal precursor comprises Cu—In—Ga.

3. The method of claim 1, wherein said homogenizing is performed in an inert atmosphere.

4. The method of claim 1, wherein said selenizing further comprises heating said metal precursor while flowing said diethyl selenium to reach a temperature above 450° C. for a sufficient time to complete formation of said CIGSS layer.

5. The method of claim 1, further comprising the step of annealing said CIGSS layer in a sulfur comprising ambient, wherein a selenized CIGSS absorber layer is formed.

6. The method of claim 1, further comprising the steps of:
    providing a substrate, and depositing a back contact layer prior to forming said CIGSS absorber layer, wherein said CIGSS absorber layer is formed on said back contact layer,
    depositing a heterojunction partner layer on said CIGSS absorber layer,
    depositing an optically transparent and conducting window layer on said heterojunction partner layer, and
    forming contact fingers on said optically transparent and conducting window layer, wherein a solar cell is formed.

7. The method of claim 1, wherein all components of said metallic precursor are deposited by a sputtering process.

8. The method of claim 1, wherein said temperature sufficient for homogenizing said metal precursor but below a melting point of indium comprises 120 to 140° C.

* * * * *